United States Patent
Verma et al.

(10) Patent No.: US 7,326,609 B2
(45) Date of Patent: Feb. 5, 2008

(54) SEMICONDUCTOR DEVICE AND FABRICATION METHOD

(75) Inventors: Purakh Raj Verma, Singapore (SG); Liang-Choo Hsia, Singapore (SG); Dong Kyun Sohn, Singapore (SG); Guowei Zhang, Singapore (SG); Chew Hoe Ang, Singapore (SG); Yun Ling Tan, Singapore (SG); Zhao Lun, Singapore (SG); Jae Gon Lee, Singapore (SG); Yung Fu Chong, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 365 days.

(21) Appl. No.: 10/908,328

(22) Filed: May 6, 2005

(65) Prior Publication Data

US 2006/0252188 A1 Nov. 9, 2006

(51) Int. Cl.
*H01L 21/8238* (2006.01)
(52) U.S. Cl. .............................. 438/231; 257/E21.638
(58) Field of Classification Search ................ 438/230, 438/231, 232; 257/E21.638
See application file for complete search history.

(56) References Cited

U.S. PATENT DOCUMENTS

| 4,769,686 | A | | 9/1988 | Horiuchi et al. | ............ 357/23.8 |
| 5,534,723 | A | | 7/1996 | Iwai et al. | .................. 431/568 |
| 5,880,502 | A | * | 3/1999 | Lee et al. | ..................... 257/372 |
| 5,917,218 | A | | 6/1999 | Choi | ........................... 257/345 |
| 6,071,775 | A | | 6/2000 | Choi | ........................... 438/257 |
| 6,720,222 | B2 | * | 4/2004 | Kanda et al. | ............... 438/289 |

* cited by examiner

*Primary Examiner*—Chandra Chaudhari
(74) *Attorney, Agent, or Firm*—Mikio Ishimaru

(57) ABSTRACT

A method and apparatus for manufacturing a semiconductor device is provides a substrate having a first region and a second region. A sacrificial first gate is formed in the first region. Source/drain are formed in the first region. A second region gate dielectric is formed in the second region. A second region gate is formed on the second region gate dielectric. A second region source/drain is formed in the second region. A sacrificial layer is formed over the sacrificial first gate, the source/drain, the first region, and the second region. The sacrificial first gate is exposed. A gate space is formed by removing the sacrificial first gate. A first region gate dielectric is formed in the gate space. A first region gate is formed on the first region gate dielectric. The sacrificial layer is removed.

10 Claims, 4 Drawing Sheets

SEMICONDUCTOR DEVICE AND FABRICATION METHOD

TECHNICAL FIELD

The present invention relates generally to semiconductor transistors, and more particularly to a method and apparatus for transistor doping.

BACKGROUND ART

At the present time, electronic products are used in almost every aspect of life, and the heart of these electronic products is the integrated circuit. Integrated circuits are used in everything from airplanes and televisions to wristwatches.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each wafer worth hundreds or thousands of dollars.

Integrated circuits are made up of hundreds to millions of individual components. One common component is the semiconductor transistor. The most common and important semiconductor technology presently used is silicon-based, and the most preferred silicon-based semiconductor device is a complementary metal oxide semiconductor ("CMOS") transistor.

The principal elements of a CMOS transistor generally consist of a silicon substrate having shallow trench oxide isolation regions cordoning off transistor areas. The transistor areas contain polysilicon gates on silicon oxide gates, or gate dielectrics, over the silicon substrate. The silicon substrate on both sides of the polysilicon gate is slightly doped to become conductive. These lightly doped regions of the silicon substrate are referred to as "shallow source/drain", which are separated by a channel region beneath the polysilicon gate. A curved silicon oxide or silicon nitride spacer, referred to as a "sidewall spacer", on the sides of the polysilicon gate allows deposition of additional doping to form more heavily doped regions of the shallow source/drain ("S/D"), which are called "deep S/D".

To complete the transistor, a silicon oxide dielectric layer is deposited to cover the polysilicon gate, the curved spacer, and the silicon substrate. To provide electrical connections for the transistor, openings are etched in the silicon oxide dielectric layer to the polysilicon gate and the S/D. The openings are filled with metal to form electrical contacts. To complete the integrated circuits, the contacts are connected to additional levels of wiring in additional levels of dielectric material to the outside of the dielectric material.

As electronic circuits become increasingly complex, the need increases to combine high voltage transistors with low voltage transistors on an integrated circuit. High voltage transistors are found in devices such as liquid crystal display drivers and power management circuits. Low voltage transistors are found in devices such as high density static random access memory.

One type of high voltage transistor is a double diffused source/drain ("DDD"). High voltage DDD transistors are formed with processes using high energy implants and high thermal cycles. Unfortunately, these processes are harmful to low voltage transistors.

Solutions to these problems have been long sought but prior developments have not taught or suggested any solutions and, thus, solutions to these problems have long eluded those skilled in the art.

DISCLOSURE OF THE INVENTION

The present invention provides a method and apparatus for manufacturing a semiconductor device. A substrate is provided having a first region and a second region. A sacrificial first gate is formed in the first region. Source/drain are formed in the first region. A second region gate dielectric is formed in the second region. A second region gate is formed on the second region gate dielectric. A second region source/drain is formed in the second region. A sacrificial layer is formed over the sacrificial first gate, the double diffused source/drain, the first region, and the second region. The sacrificial first gate is exposed. A gate space is formed by removing the sacrificial first gate. A first region gate dielectric is formed in the gate space. A first region gate is formed on the first region gate dielectric. The sacrificial layer is removed.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
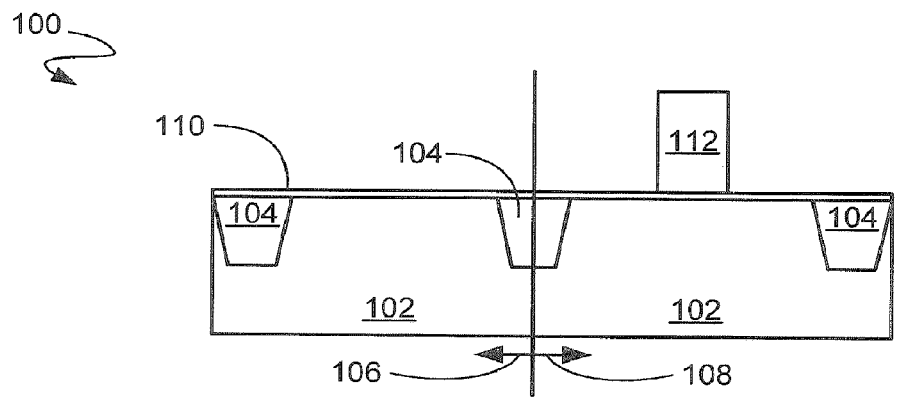
FIG. 1 is a cross sectional view of an integrated high voltage/low voltage transistor device in an intermediate stage of manufacture in accordance with an embodiment of the present invention.

In the following description, numerous specific details are given to provide a thorough understanding of the invention. However, it will be apparent that the invention may be practiced without these specific details. In order to avoid obscuring the present invention, some well-known circuits and process steps are not disclosed in detail.

Likewise, the drawings showing embodiments of the device are semi-diagrammatic and not to scale and, particularly, some of the dimensions are for the clarity of presentation and are shown exaggerated in the FIGS. The same numbers are used in all the drawing FIGS. to relate to the same elements.

The term "horizontal" as used herein is defined as a plane parallel to the conventional plane or surface of the substrate or wafer, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

As the demand for chip performance and functionality increases, there is an increasing need for the integration of low voltage ("LV") complementary metal oxide semiconductor ("CMOS"), less than about 5V, with high voltage ("HV") CMOS, about 20V-600V, on the same chip. However, HV CMOS technology preferably uses double diffused source/drain ("DDD") transistors. DDD transistors are formed with high energy implants, about 100 KeV to 1000 KeV, and high thermal drive-in cycles, greater than 800° C. However, high energy implants and high thermal drive-in cycles are not compatible with LV CMOS technology. Thus, problems occur when applying conventional techniques to integrate high voltage DDD transistors with deep submicron high density low leakage technology such as static random access memory ("SRAM") devices.

One problem occurs with formation of a thick gate dielectric, for example greater than 400 Å, for HV CMOS devices. Removal of the thick gate dielectric from the LV CMOS devices causes divots to form in shallow trench isolations ("STI") of the LV CMOS devices. The divots are formed from trapped acid, such as HF acid, which etches more of the STI. The divots make the LV CMOS devices leak current and have low yield as a result.

Another problem occurs during high energy DDD implants done after gate electrode patterning. Polysilicon gate electrodes, being common for LV CMOS and HV CMOS, are relatively thin (1500 Å to 2500 Å) and therefore cannot block DDD implant species at 100 to 1000 KeV energy range in the HV channel area.

Yet another problem occurs during drive-in processes. HV CMOS devices require higher thermal budgets (900-1050° C. for 30 to 60 minutes) for junction drive-in. However, LV CMOS devices cannot tolerate longer thermal budgets after gate patterning.

Referring now to FIG. 1, therein is shown a cross sectional view of an integrated HV/LV transistor device 100 in an intermediate stage of manufacture in accordance with an embodiment of the present invention. A substrate 102, of a material such as silicon ("Si"), has STIs 104, filled with a dielectric of a material such as silicon dioxide ("SiO$_2$").

Between the STIs 104 are a low voltage LV CMOS device region 106 and a HV CMOS device region 108 in an intermediate stage of manufacture. The LV CMOS device region 106 is used for devices such as high density SRAM. The HV CMOS device region 108 is used for devices such as liquid crystal display ("LCD") drivers and power management circuits.

On top of the substrate 102 and the STIs 104 is a sacrificial dielectric layer 110 of a material such as SiO$_2$, about 100-200 Å thick. A sacrificial HV gate 112, of another dielectric material, such as silicon nitride, is formed on the sacrificial dielectric layer 110 of the HV CMOS device region 108. The sacrificial HV gate 112 measures vertically 0.2 µm to 1.2 µm.

Figure 2:
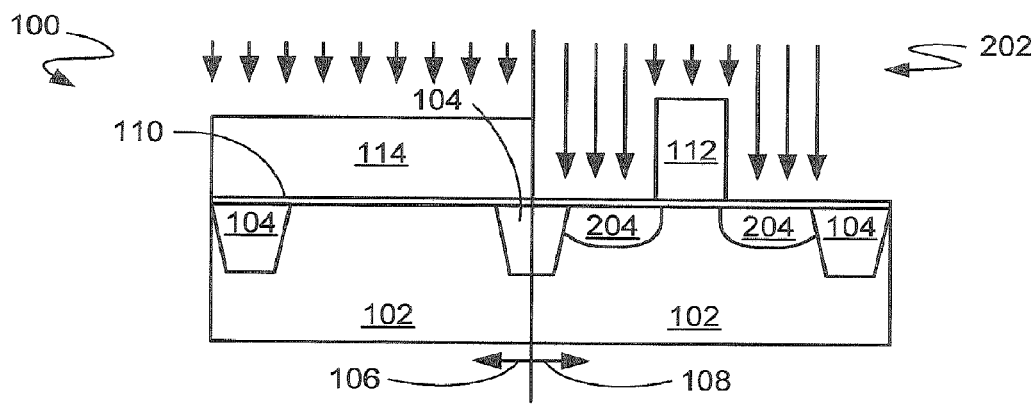
FIG. 2 is the structure of FIG. 1 after further processing and the addition of a double diffused source/drain.

Referring now to FIG. 2, therein is shown the structure of FIG. 1 after further processing. The sacrificial HV gate 112 and a mask 114 allow a high energy implant 202 of the HV CMOS device region 108. The high energy implant 202, followed by a thermal drive-in, forms DDDs 204. The DDDs 204 are self-aligned to the sacrificial HV gate 112.

Due to the higher blocking power of the thick nitride of the sacrificial gate 112 preventing penetration in HV channel region, the energy of the DDD implants in this case can be high, about 100-1000 KeV, and hence the requirement of long diffusion thermal cycles to achieve deeper DDD junctions is minimized. Several problems with the prior art are solved by the completion of the LV CMOS device region 106 with the high energy implant 202 and the long thermal drive.

Because the gate of the LV CMOS device region 106 has not yet been formed, the high energy implant 202 and long drive cannot damage the gate.

Also, because the LV structures and implants have not yet been formed on the LV CMOS device region 106, the high thermal budget drive for forming the DDD 204 of the HV CMOS device region 108 cannot effect the LV structures and implants. This results in a graded profile of the DDD 204 and high voltage capability.

Figure 3:
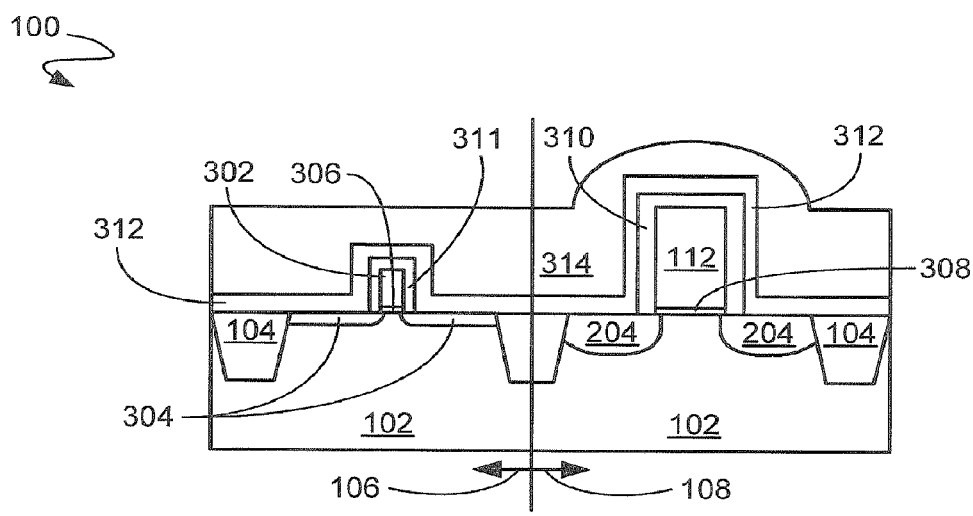
FIG. 3 is the structure of FIG. 2 after further processing and addition of a low voltage gate, lightly doped source/drains, first dielectric layer, second dielectric layer, and sacrificial dielectric layer.
Figure 5:
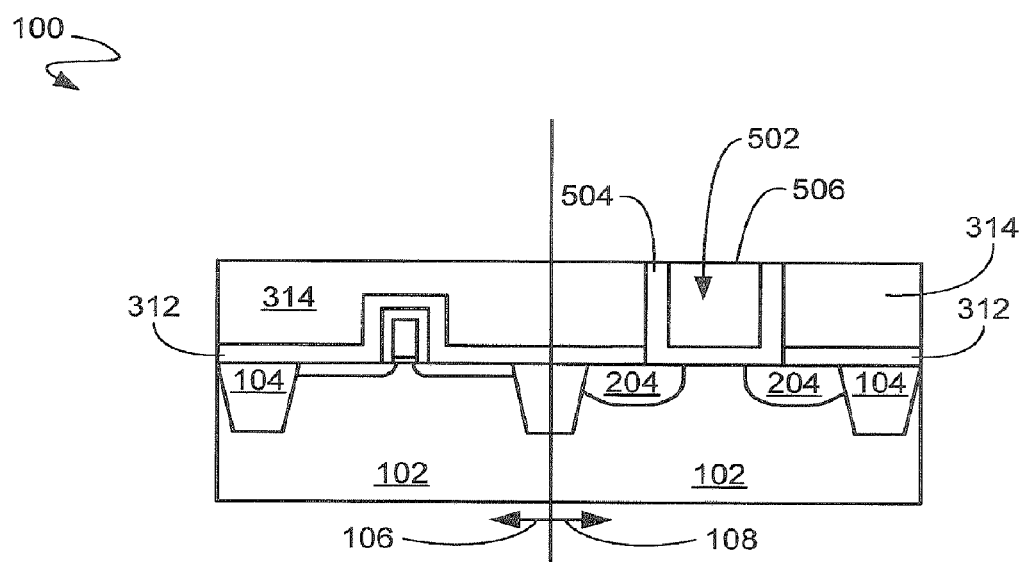
FIG. 5 is the structure of FIG. 4 after further processing and addition of a high voltage gate dielectric and a high voltage gate.

Referring now to FIG. 3, therein is shown the structure of FIG. 2 after further processing of removing the mask 114 (FIG. 2) and the sacrificial dielectric layer 110 (FIG. 2), growing a LV gate dielectric 306, depositing a gate electrode poly-silicon layer (not shown) which after photolithographic processing forms a LV gate 302 in the LV CMOS device region 106. The LV gate 302 is thinner than the HV gate 506 (FIG. 5). Lightly doped source/drains ("LDDs") 304 are formed in the LV CMOS device region 106 using standard implant procedures (not shown).

An etch removes the sacrificial dielectric layer 110 (FIG. 2) leaving a sacrificial HV gate dielectric 308. A first liner 310 of a dielectric layer, such as tetraethyl orthosilicate ("TEOS"), is formed over the sacrificial HV gate 112. A second liner 311 of a dielectric layer, such as TEOS, is formed over the LV gate 302. A prespacer layer 312 of another dielectric material, such as SiN, is formed over the STIs 104, the LDDs 304, the first liner 310, the second liner 311, and the DDDs 204. A sacrificial layer 314 of a dielectric layer, such as TEOS, is formed over the prespacer layer 312.

Figure 4:
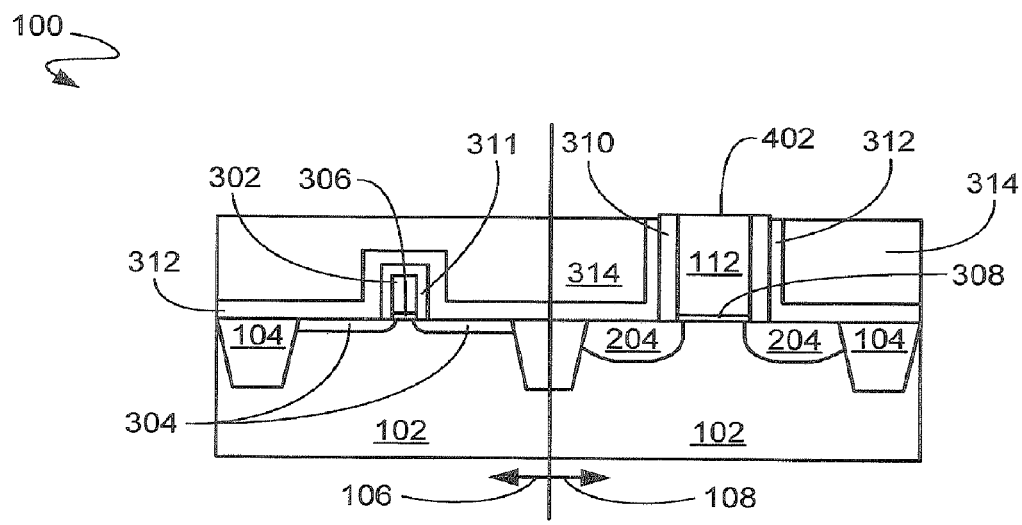
FIG. 4 is the structure of FIG. 3 after further processing and chemical mechanical planarization of the sacrificial dielectric layer.

Referring now to FIG. 4, therein is shown the structure of FIG. 3 after further processing. A chemical mechanical planarization ("CMP") (not shown), such as an oxide CMP, is performed on the sacrificial layer 314. The CMP exposes a top surface 402 of the sacrificial HV gate 112.

Referring now to FIG. 5, therein is shown the structure of FIG. 4 after further processing. The sacrificial HV gate 112 (FIG. 4), the sacrificial HV gate dielectric 308 (FIG. 4), and the first liner 310 (FIG. 4) are removed by phosphoric acid and a hydrofluoric acid dip. Thus a gate space 502 is formed.

A chemical vapor deposited dielectric, such as SiO$_2$, lines the gate space 502, forming a HV gate dielectric 504 of the HV CMOS device region 108. In one embodiment, the HV gate dielectric 504 is formed, for example to a thickness greater than 400 Å. During formation of the HV gate dielectric 504, the sacrificial layer 314 and the prespacer layer 312 protect the STIs 104. Thus, divot formation in the STIs 104 is avoided, thereby solving the problem of leaky, low yield LV CMOS devices caused by divots.

The gate space 502 is filled with in situ doped polysilicon or metal, such as aluminum, and forms a HV gate 506. A CMP is performed on the sacrificial layer 314 down to the HV gate dielectric 504.

Figure 6:
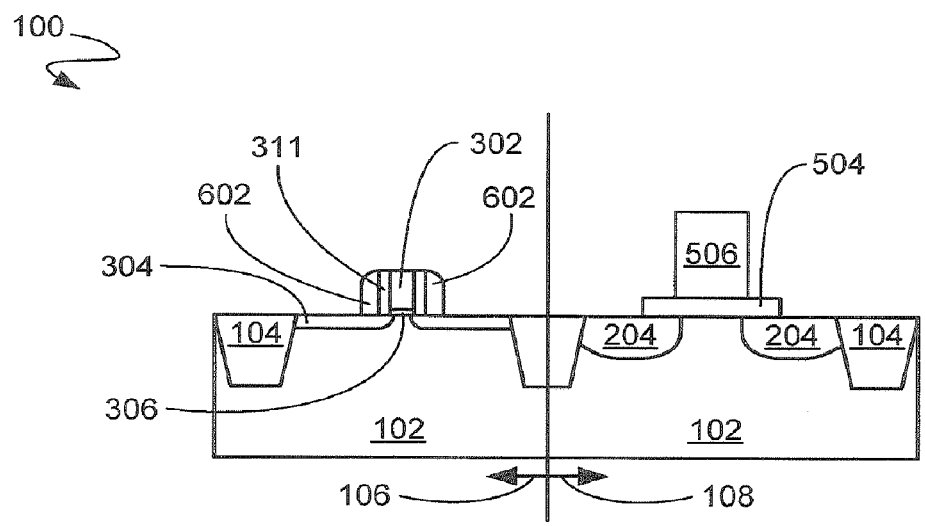
FIG. 6 is the structure of FIG. 5 after further processing and removal of the sacrificial dielectric layer and the second dielectric layer.

Referring now to FIG. 6, therein is shown the structure of FIG. 5 after further processing. An isotropic etch removes the sacrificial layer 314 (FIG. 5) and the exposed regions of the HV gate dielectric 504 on either side of the HV gate 506. An anisotropic etch then etches the prespacer layer 312 (FIG. 5), thus forming a LV spacer 602 around the LV gate 302.

Figure 7:
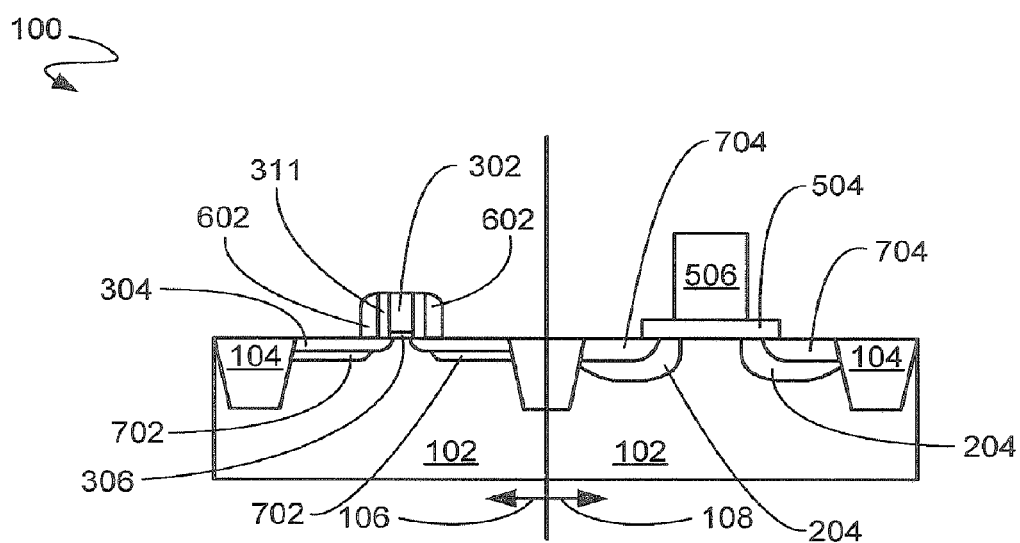
FIG. 7 is the structure of FIG. 6 after further processing and addition of low voltage source/drain and high voltage source/drain.

Referring now to FIG. 7, therein is shown the structure of FIG. 6 after further processing. Standard back end of line processes are used to form the remaining structures, such as LV source/drains 702 and HV source/drains 704, to complete the integrated HV/LV transistor device 100.

Figure 8:
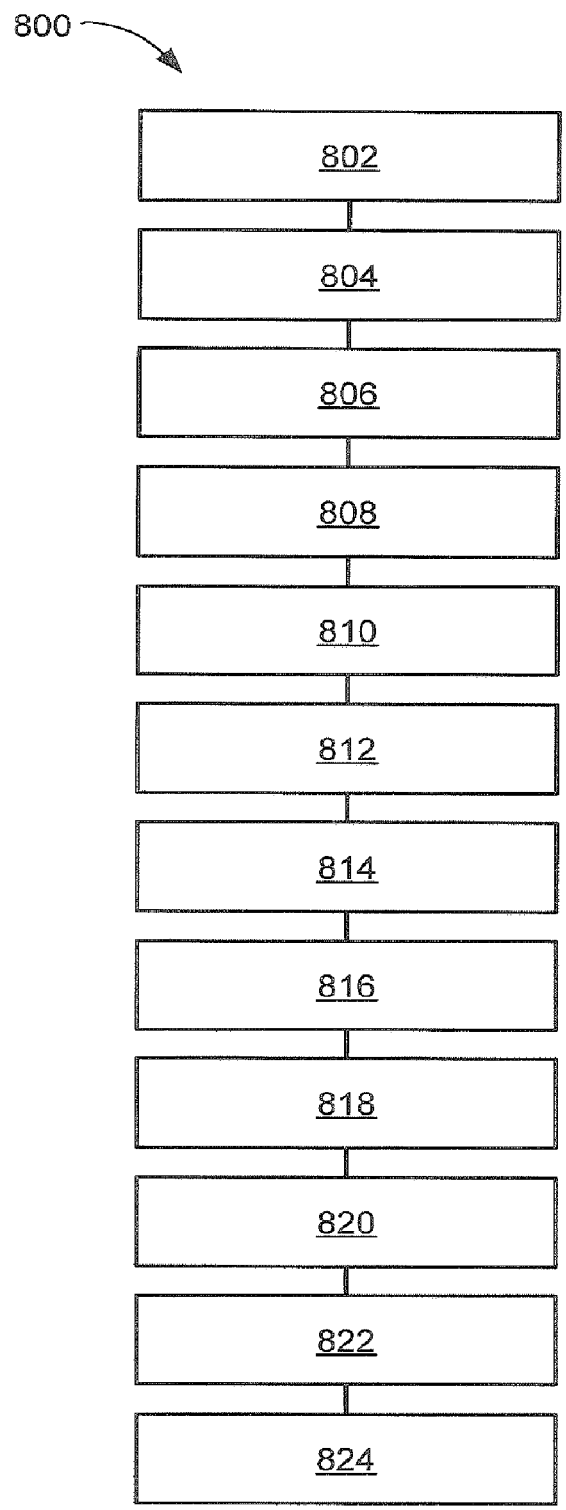
FIG. 8 is a flow chart of a method for manufacturing a semiconductor device in accordance with an embodiment of the present invention.

Referring now to FIG. 8, therein is shown a flow chart of a method 800 for manufacturing a semiconductor device in accordance with the present invention. The method 800 includes providing a substrate having a first region and a second region in a block 802; forming a sacrificial first gate in the first region in a block 804; forming source/drain in the first region in a block 806; forming a second region gate dielectric in the second region in a block 808; forming a second region gate on the second region gate dielectric in a block 810; forming a second region source/drain in the second region in a block 812; forming a sacrificial layer over the sacrificial first gate, the double diffused source/drain, the first region, and the second region in a block 814; exposing the sacrificial first gate in a block 816; forming a gate space by removing the sacrificial first gate in a block 818; forming a first region gate dielectric in the gate space in a block 820; forming a first region gate on the first region gate dielectric in a block 822; and removing the sacrificial layer in a block 824.

Thus, it has been discovered that the semiconductor device method and apparatus of the present invention furnish important and heretofore unknown and unavailable solutions, capabilities, and functional advantages for integrating the manufacture of high voltage DDD transistors with low voltage transistors on the same chip. The resulting processes and configurations are straightforward, economical, uncomplicated, highly versatile and effective, can be implemented by adapting known technologies, and are thus fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method for manufacturing a semiconductor device, comprising:
   providing a substrate having a first region and a second region;
   forming a sacrificial first gate in the first region;
   forming source/drain in the first region;
   forming a second region gate dielectric in the second region;
   forming a second region gate on the second region gate dielectric;
   forming a second region source/drain in the second region;
   forming a sacrificial layer over the sacrificial first gate, the source/drain, the first region, and the second region;
   exposing the sacrificial first gate;
   forming a gate space by removing the sacrificial first gate;
   forming a first region gate dielectric in the gate space;
   forming a first region gate on the first region gate dielectric; and
   removing the sacrificial layer.

2. The method of claim 1 wherein exposing the sacrificial first gate uses planarization of the sacrificial layer.

3. The method of claim 1 further comprising forming a first region source/drain in the first region.

4. The method of claim 1 wherein forming the second region source/drain forms a lightly doped source/drain.

5. The method of claim 1 wherein forming the first region gate dielectric further comprises forming the first region gate dielectric with a thickness of greater than 400 Å.

6. A method for manufacturing a semiconductor device, comprising:
   providing a substrate having a high voltage device region and a low voltage device region;
   forming shallow trench isolations between and around the high voltage device region and the low voltage device region;
   forming a sacrificial dielectric layer on the substrate and the shallow trench isolations;
   forming a sacrificial high voltage gate on the sacrificial dielectric layer in the high voltage device region;
   forming double diffused source/drain in the high voltage device region;
   forming a low voltage gate on the sacrificial dielectric layer in the low voltage device region;
   forming a sacrificial high voltage gate dielectric and a low voltage gate dielectric by removing the sacrificial dielectric layer;
   forming lightly doped source/drain in the low voltage device region;
   forming a first liner over the sacrificial high voltage gate;
   forming a second liner over the low voltage gate;
   forming a prespacer layer over the shallow trench isolations, the low voltage device region source/drain, the first liner, the second liner, and the double diffused source/drain;
   forming a sacrificial layer over the prespacer layer;
   exposing a top surface of the sacrificial high voltage gate;
   forming a gate space by removing the sacrificial high voltage gate, the sacrificial high voltage gate dielectric, and the first liner;
   forming a high voltage gate dielectric in the gate space;
   forming a high voltage gate on the high voltage gate dielectric;
   removing the sacrificial layer;
   forming a low voltage spacer around the low voltage gate by removing the prespacer layer;
   forming a low voltage source/drain in the low voltage device region; and
   forming a high voltage source/drain in the high voltage device region.

7. The method of claim 6 wherein:
forming the sacrificial high voltage gate further comprises forming the sacrificial high voltage gate to measure vertically 0.2 µm to 1.2 µm; and
exposing the top surface of the sacrificial high voltage gate uses chemical mechanical planarization of the sacrificial layer.

8. The method of claim 6 wherein
forming the prespacer layer uses a nitride; and
forming the sacrificial layer uses tetraethyl orthosilicate.

9. The method of claim 6 wherein:
removing the sacrificial layer uses an isotropic etch; and
removing the prespacer layer uses an anisotropic etch.

10. The method of claim 6 wherein:
forming the gate space further comprises removing the sacrificial high voltage gate, the sacrificial high voltage gate dielectric, and the first liner by phosphoric acid and hydrofluoric dip; and
forming the high voltage gate dielectric further comprises forming the high voltage gate dielectric with a thickness of greater than 400 Å by chemical vapor disposition.

* * * * *